(12) United States Patent
Cazzaniga et al.

(10) Patent No.: US 8,354,900 B2
(45) Date of Patent: Jan. 15, 2013

(54) MICROELECTROMECHANICAL DEVICE PROVIDED WITH AN ANTI-STICTION STRUCTURE, AND CORRESPONDING ANTI-STICTION METHOD

(75) Inventors: Gabriele Cazzaniga, Rosate (IT); Luca Coronato, Corsico (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 145 days.

(21) Appl. No.: 12/571,080

(22) Filed: Sep. 30, 2009

(65) Prior Publication Data

US 2010/0078740 A1 Apr. 1, 2010

(30) Foreign Application Priority Data

Sep. 30, 2008 (IT) .............................. TO2008A0714

(51) Int. Cl.
*H01H 51/22* (2006.01)
(52) U.S. Cl. .......................................... 335/78; 200/181
(58) Field of Classification Search .................... 335/78; 200/181
See application file for complete search history.

(56) References Cited

U.S. PATENT DOCUMENTS

| | | | | |
|---|---|---|---|---|
| 6,115,231 A * | 9/2000 | Shirakawa | ..................... | 361/233 |
| 6,307,169 B1 * | 10/2001 | Sun et al. | ...................... | 200/181 |
| 6,876,482 B2 * | 4/2005 | DeReus | ........................ | 359/290 |
| 7,242,273 B2 * | 7/2007 | Isobe et al. | ....................... | 335/78 |
| 7,258,008 B2 | 8/2007 | Durante et al. | | |
| 7,362,199 B2 * | 4/2008 | Chou et al. | ...................... | 335/78 |
| 7,501,920 B2 * | 3/2009 | Yuba et al. | ....................... | 335/78 |
| 2003/0217597 A1 | 11/2003 | Kumagai et al. | | |
| 2004/0182157 A1 | 9/2004 | Sakai et al. | | |
| 2005/0269898 A1 | 12/2005 | Miller et al. | | |
| 2007/0236675 A1 | 10/2007 | Venema | | |

OTHER PUBLICATIONS

Search Report for Italian Patent Application No. IT 2008A000714; Sep. 2, 2009.

* cited by examiner

*Primary Examiner* — Bernard Rojas
(74) *Attorney, Agent, or Firm* — Seed IP Law Group PLLC

(57) ABSTRACT

An embodiment of a microelectromechanical device having a first structural element, a second structural element, which is mobile with respect to the first structural element, and an elastic supporting structure, which extends between the first and second structural elements to enable a relative movement between the first and second structural elements. The microelectromechanical device moreover possesses an anti-stiction structure, which includes at least one flexible element, which is fixed only with respect to the first structural element and, in a condition of rest, is set at a first distance from the second structural element. The anti-stiction structure is designed to generate a repulsive force between the first and second structural elements in the case of relative movement by an amount greater than the first distance.

17 Claims, 7 Drawing Sheets

MICROELECTROMECHANICAL DEVICE PROVIDED WITH AN ANTI-STICTION STRUCTURE, AND CORRESPONDING ANTI-STICTION METHOD

PRIORITY CLAIM

The present application claims the benefit of Italian Patent Application Serial No.: TO2008A000714, filed Sep. 30, 2008, which application is incorporated herein by reference in its entirety.

TECHNICAL FIELD

An embodiment of the present invention relates to a microelectromechanical device provided with an anti-stiction structure and to the corresponding anti-stiction method.

BACKGROUND

As is known, a microelectromechanical device (MEMS) is constituted by one or more mobile structures provided on a substrate and frequently equipped with an actuator and a guide that regulates movement thereof. In general, there are three types of actuators: a first type enables movement in a direction parallel to the substrate; a second type enables movement in a direction perpendicular to the substrate; whilst a third type enables a rotary movement within a specific range of angles.

A significant defect, which arises in particular conditions in the MEMS devices considered, is the adhesion (stiction) of the mobile structures to a fixed element adjacent thereto, or directly to the substrate. It is clear that said phenomenon can lead to serious consequences, even to the point of rendering the MEMS systems affected thereby inoperative in an unforeseeable way.

The phenomenon of stiction, in MEMS systems, is generated by the surface forces that are exerted between the surfaces of two bodies that are in contact. Of course, the more extensive the area of contact, the greater the force of interaction between the surfaces. In addition, further factors that intervene in the phenomenon of stiction, are, among other things, the roughness of the surfaces, their degree of wear, the level of humidity and the temperature of the environment in which the microelectromechanical structures operate.

Techniques currently used for reduction of the phenomena of stiction in MEMS structures are based upon the reduction of the surfaces of contact and upon low levels of humidity, thus creating conditions that are unfavorable to the occurrence of phenomena of stiction.

However, during use, MEMS structures of a mobile type may come into contact with further surrounding MEMS structures of a fixed type, for example, involuntarily on account of shock. Continuous contacts between MEMS structures can be the cause of a progressive degradation both of the surface of contact of the mobile structures and of the surface of contact of the surrounding fixed structures. The formation of particles of material, that occurs following upon the continuous impacts between the surfaces, is itself a further cause of stiction. Consequently, it happens that, in these cases, the mobile structures may adhere to the fixed structures, thus jeopardizing their functionality.

SUMMARY

An embodiment of the present invention is a microelectromechanical device and a corresponding method that overcome the drawbacks of the known art.

BRIEF DESCRIPTION OF THE DRAWINGS

For a better understanding of one or more embodiments of the present invention, embodiments thereof are now described, purely by way of non-limiting example, with reference to the annexed drawings, wherein.

DETAILED DESCRIPTION

Figure 1A:
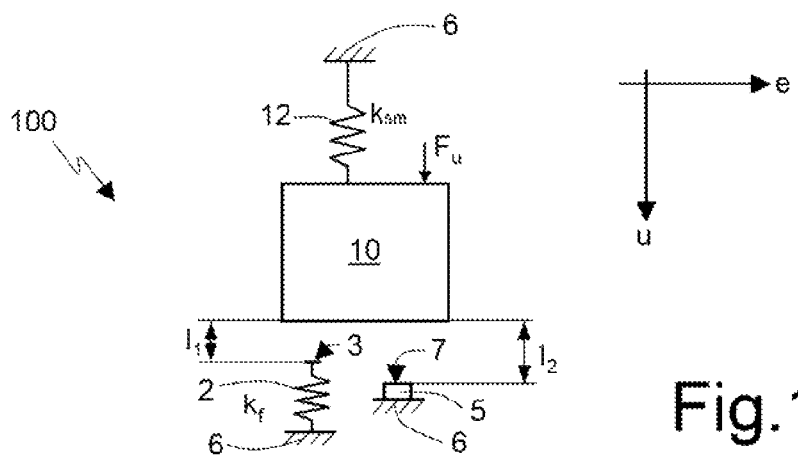
FIGS. 1A-1C show a mechanical model of a MEMS device provided with an anti-stiction structure according to an embodiment of the present invention, in three operating steps.
Figure 1B:
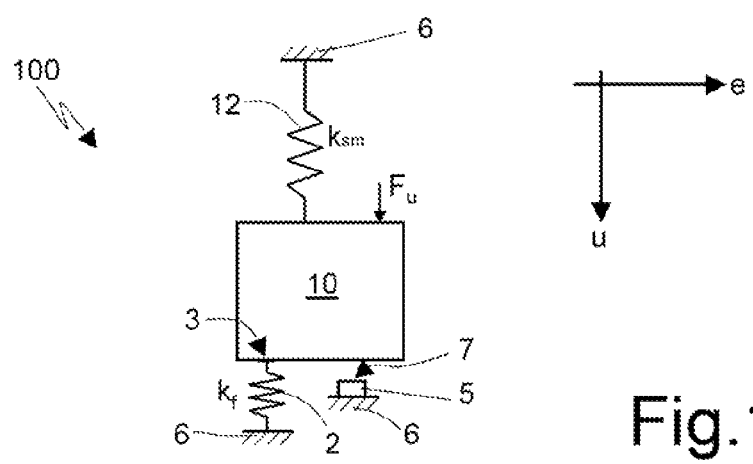
Figure 1C:
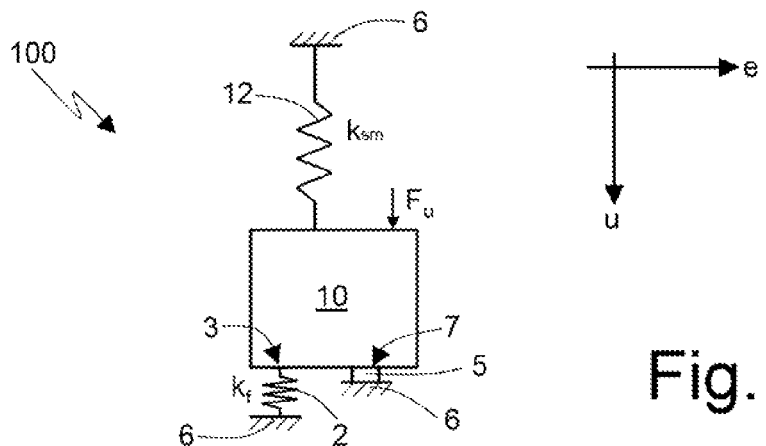

FIGS. 1A-1C are schematic illustrations of a mechanical model of an embodiment of an anti-stiction structure 1 for a microelectromechanical (MEMS) device, defined hereinafter simply as device 100, during three operating steps.

In detail, the device 100 is represented schematically in its main components and comprises: a first structural element; a second structural element; an elastic supporting structure set between the first and second structural elements and enabling a relative movement between them; and an anti-stiction structure and an arrest structure, which are connected to the first structural element or to the second structural element. In particular, the first structural element is formed here by a mobile mass 10, the second structural element is formed here by a load-bearing structure 6, the elastic supporting structure comprises one or more suspension springs 12, the anti-stiction structure comprises at least one flexible element 2, and the arrest structure comprises a stop element 5.

The suspension springs 12 (just one of which is illustrated) have the function of enabling movement of the mobile mass 10 only in pre-set directions. In the example of FIGS. 1A-1C, the suspension springs 12, which have an elastic constant $K_{sm}$, enable movement of the mobile mass 10 only in a direction u.

The flexible element 2 is anchored to the load-bearing structure 6 and is provided with a resting portion 3. In particular, the flexible element 2 is of an elastic type, with an elastic constant $K_f$ greater than that of the suspension spring 12, for example 10-1000 times greater.

The stop element 5 is formed by a rigid structure, for example, by a projection of the load-bearing structure 6, and has the function of limiting the movements of the mobile mass 10 and of the corresponding suspension spring or springs 12 and thus preventing any undesirable failure. The stop element 5 is anchored to the load-bearing structure 6 and provided with a contrast surface 7.

The load-bearing structure 6 may, for example, be a substrate on which the anti-stiction structure 1 is provided, an intermediate element between the substrate and the mobile mass 10, or any other structural element. Furthermore, the flexible element 2, the stop element 5, and the mobile mass 10 may be carried by different portions of the load-bearing structure 6.

In conditions of rest, the mobile mass 10 is set at a distance from the flexible element 2 and the stop element 5.

FIG. 1A shows the device 100 in conditions of rest, i.e., in the absence of external forces $F_u$ acting in the direction u on the mobile mass 10 ($F_u=0$). In said condition, we shall assume that the mobile mass 10 is set at a first distance $I_1$ from the flexible element 2 and at a second distance $I_2$ from the stop element 5, with $I_1 < I_2$.

When an external force $F_u > 0$ acts in the direction u on the mobile mass 10, the latter undergoes a displacement with consequent reduction of the distances $I_1$ and $I_2$. In this step, the flexible element 2 does not intervene, and hence does not modify the characteristics of stiffness and hence of sensitivity of the structure, set in the design stage, by appropriately sizing the elements of the device and in particular the suspension springs 12.

When the mobile mass 10 displaces by a distance greater than $I_1$ but less than $I_2$ (FIG. 1B), it initially comes into contact with the resting portion 3 of the flexible element 2, then causes bending of the flexible element 2 itself, which generates a braking force that opposes the further movement of the mobile mass 10. Since the flexible element 2 is elastic, in the impact the surfaces in contact of the mobile mass 10 and the flexible element 2 do not degrade, or in any case degrade in a considerably reduced way with respect to what would occur in the case of direct impact with a rigid element, with a very low constant of elasticity, for example with the stop element 5.

Even though the external force $F_u$ is sufficiently high to bring the mobile mass 10 into contact with the stop element 5 (FIG. 1C), on account of the braking force, the impact is considerably reduced, consequently reducing the degradation of the mobile mass 10 and of the stop element 5.

It may in any case happen that, following upon an intense use of the device 100, the surfaces of contact of the mobile mass 10 and of the stop element 5 wear out, with the consequent formation of a deposit of particles of material, and generation of phenomena of stiction. In practice, a force of stiction $F_{ad}$ is set up.

However, the flexible element 2 exerts on the mobile mass 10 a repulsive force $F_r$ of opposite sign with respect to the force of stiction $F_{ad}$. Furthermore, also the suspension spring 12 exerts a force $F_{sm}$ that is of opposite sign to the force of stiction $F_{ad}$.

The total repulsive force $F_{rep}$ is consequently given by the following formula:

$$F_{rep} = K_{sm} \cdot I_2 + K_f (I_2 - I_1).$$

When the external force $F_u$ is removed from the mobile mass 10, the forces acting on the mobile mass 10 are the repulsive force $F_{rep}$ and the force of stiction $F_{ad}$. By appropriately sizing the device 100, it is possible to cause the repulsive force $F_{rep}$ to be always greater than the force of stiction $F_{ad}$ so as to guarantee always separation of the mobile mass 10 from the stop element 5.

Figure 2:
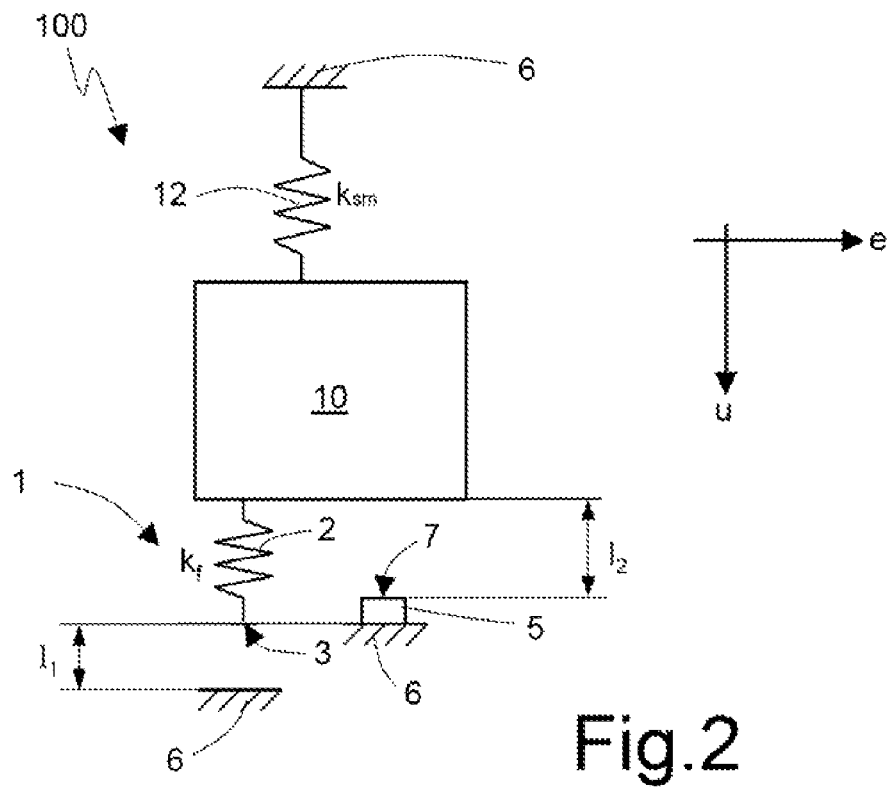
FIG. 2 shows a mechanical model of a MEMS device provided with an anti-stiction structure according to another embodiment of the present invention.

FIG. 2 shows a different embodiment of the anti-stiction structure 1.

In this case, the flexible element 2 is set fixed with respect to the mobile mass 10, whilst the resting portion 3 has the function of point of contact with the load-bearing structure 6. In this case, $I_1$ is the distance between the resting portion 3 and the load-bearing structure 6, but operation is altogether similar to what has been described previously.

Figure 3:
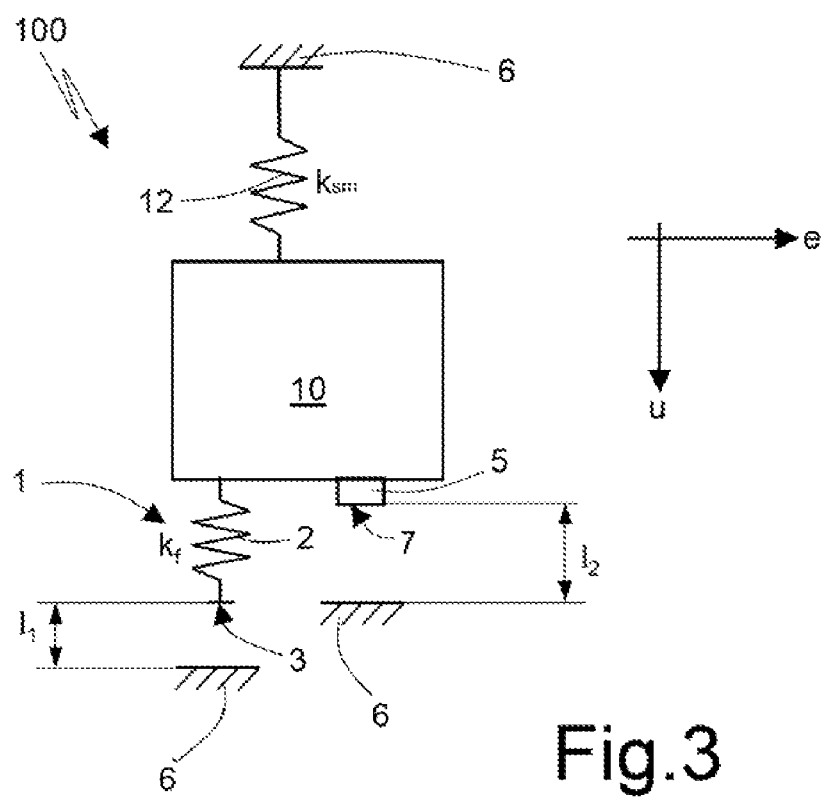
FIG. 3 shows a mechanical model of a MEMS device provided with an anti-stiction structure according to a further embodiment of the present invention.

In FIG. 3, the arrest element 5 is formed on the mobile mass 10, and the contrast surface 7 has the function of point of contact with the load-bearing structure 6. Otherwise, the structure is the same as that of FIG. 2.

Figure 4A:
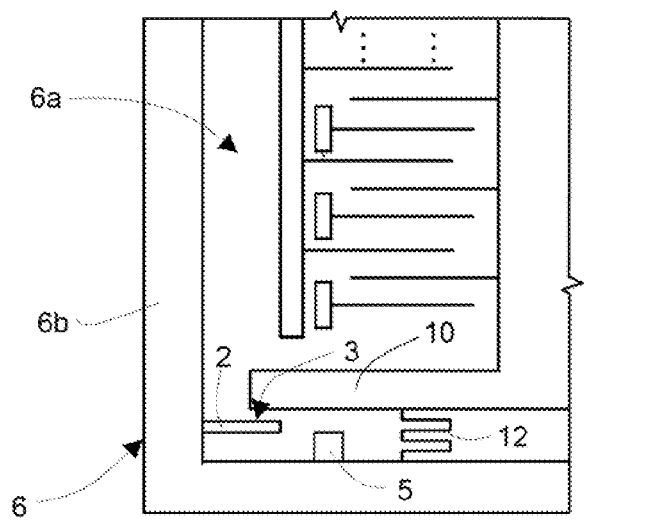
FIGS. 4A-4C show simplified top-plan views of a possible implementation of the MEMS device of FIGS. 1A-1C, in the same three operating steps.
Figure 4B:
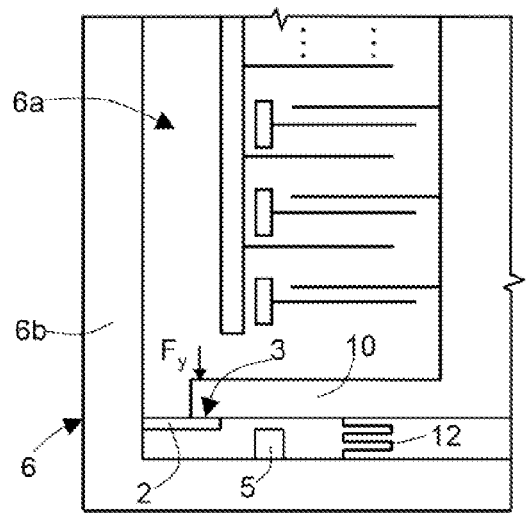
Figure 4C:
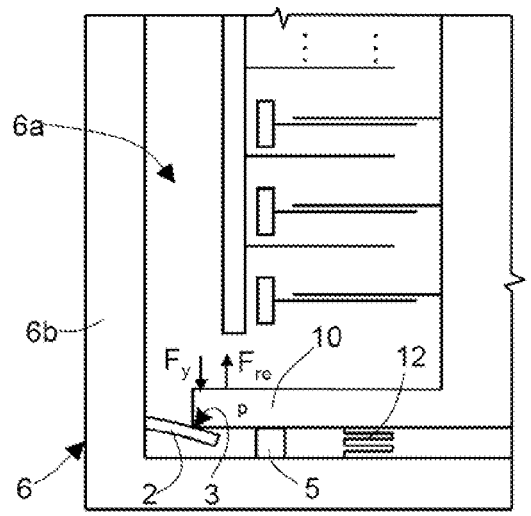

FIGS. 4A-4C show, in top-plan view, a possible implementation of the anti-stiction structure 1 of FIGS. 1A-1C, for example applied to the microelectromechanical gyroscope described in the patent application No. EP-A-1 1677 073 (U.S. Pat. No. 7,258,008), which are incorporated by reference, in which the load-bearing structure 6 comprises a substrate (just one surface 6a of which is visible) and a frame 6b of a rectangular shape, and the mobile mass 10 is suspended above the surface 6a via elastic springs 12 carried by the frame 6b.

In particular, FIGS. 4A-4C show three successive operating conditions of the anti-stiction structure 1, corresponding to FIGS. 1A-1C, respectively. According to this embodiment, the flexible element 2 is provided by a beam element, for example made of monocrystalline or polycrystalline silicon, having one end anchored to the load-bearing structure 6 and the resting portion 3 free to move in a plane xy. The stop element 5 is formed by a projection of the load-bearing structure 6 extending towards the mobile mass 10.

The mobile mass 10 is typically set in the same plane xy as the frame 6b and is mobile in the plane xy, ideally in the direction y.

In conditions of rest, when an external force $F_y$ acting on the mobile mass 10 is equal to zero (FIG. 4A), the mobile mass 10 is set at a distance from the flexible element 2 and from the stop element 5, and, consequently, the flexible element 2 is at rest.

When an external force $F_y$ different from zero acts on the mobile mass 2, the suspension spring 12 bends, and the mobile mass 10 comes into contact with the flexible element 2, but, initially, not with the stop element 5 (FIG. 4B). If the force is sufficiently high, the mobile mass 10 in its movement generates a bending of the flexible element 2 and comes into contact with the stop element 5, which arrests motion thereof (FIG. 4C). As already explained, the flexible element 2 generates in this step a repulsive force $F_{rep}$ that opposes the further movement of the mobile mass, reducing the speed of impact thereof against the stop element 5.

As soon as the external force $F_y$ terminates, the repulsive force $F_{rep}$ generated by the flexible element 2 co-operates with the force generated by the suspension spring 12 to bring the mobile mass 10 back into the state of rest, overcoming the force of stiction $F_{ad}$ and thus preventing stiction of the mobile mass 10 to the stop element 5.

Figure 5:
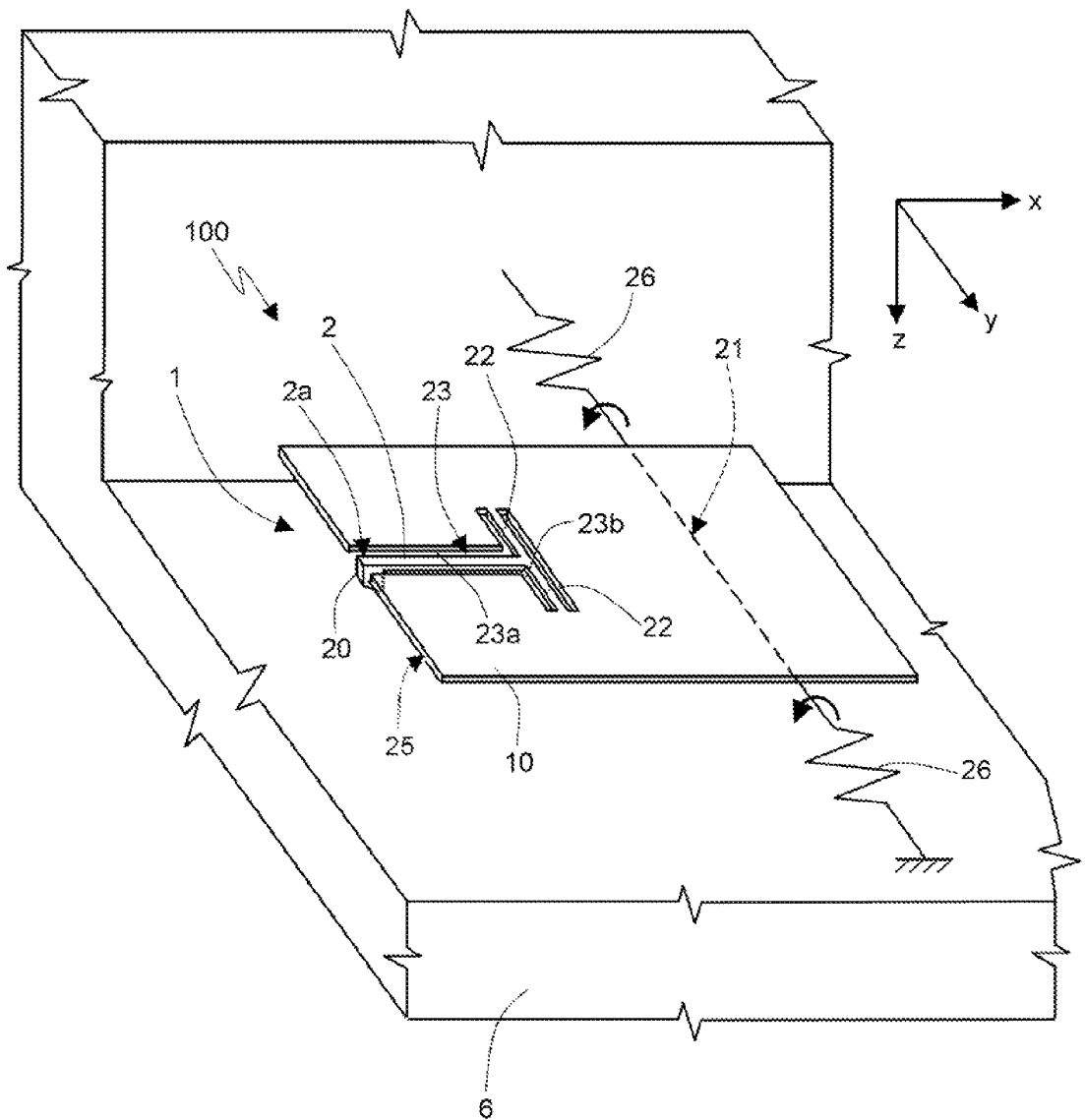
FIG. 5 shows a simplified perspective view of a possible implementation of the MEMS device of FIG. 2.

FIG. 5 shows a further embodiment of an anti-stiction structure 1, which may be used with a mobile mass 10 that moves perpendicularly or with rotary movement with respect to the load-bearing structure 6, formed here by a substrate.

Here, the flexible element 2, with an elongated shape, is fixed to the mobile mass 10 and precisely is surrounded by the mobile mass 10 itself, from which it is separated by a trench 23, obtained using micromachining techniques of a known type.

In detail, the trench 23 is T-shaped, with a first portion 23a extending in a transverse direction and from a freely oscillable side of the mobile mass 10 and a second portion 23b extending in a direction transverse to the first portion 23a. The flexible element 2 extends along the first portion 23a of the trench 23 and is connected to the mobile mass 10 via a second torsional spring 22 extending along the second portion 23b of the trench 23.

The flexible element 2 has a projecting portion formed here by a bump 20 extending from a free end 2a of the flexible element 2, in a direction transverse to the plane of the mobile mass 10, towards the substrate 6. In practice, the bump 20 can be constituted by a portion of the flexible element 2 having a thickness greater than that of the mobile mass 10.

The mobile mass 10 is set at a distance from the substrate 6 and is supported by means of first torsional springs 26 that enable a rotary movement thereof about an axis of rotation 21.

Figure 6A:
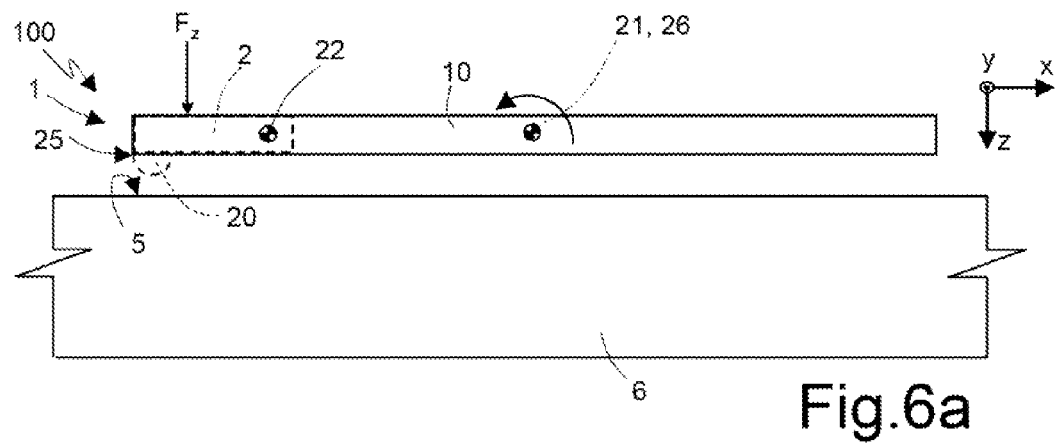
FIGS. 6A-6C show side views of the MEMS device of FIG. 5 during successive operating steps.

In a condition of rest (FIG. 6A), when no external force acts on the mobile mass 10 ($F_z=0$), the mobile mass 10 is substantially parallel to the substrate 6.

Figure 6B:
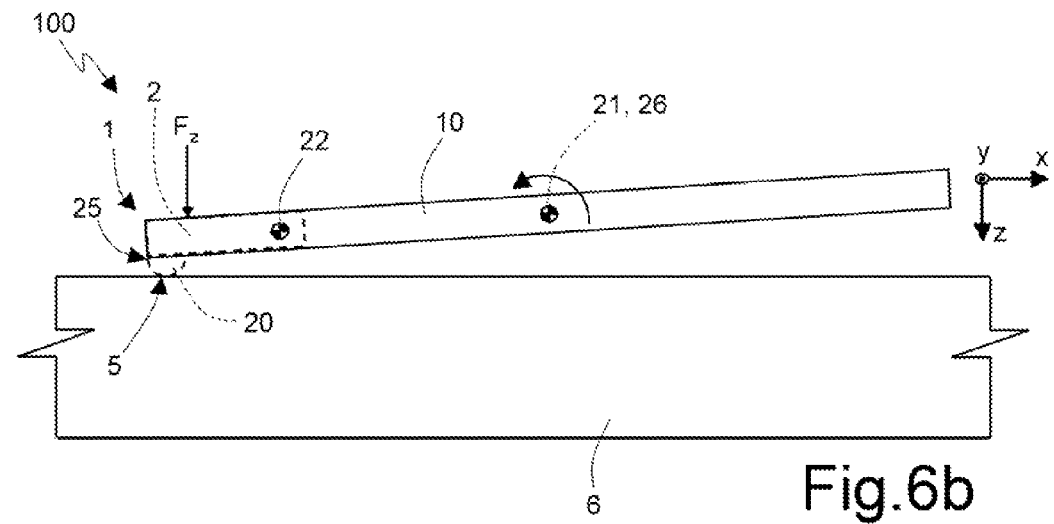

In the presence of a high force $F_z$, the mobile mass 10 turns about the axis of rotation 21 until the bump 20 is brought into contact with the substrate 6 (FIG. 6B).

Figure 6C:
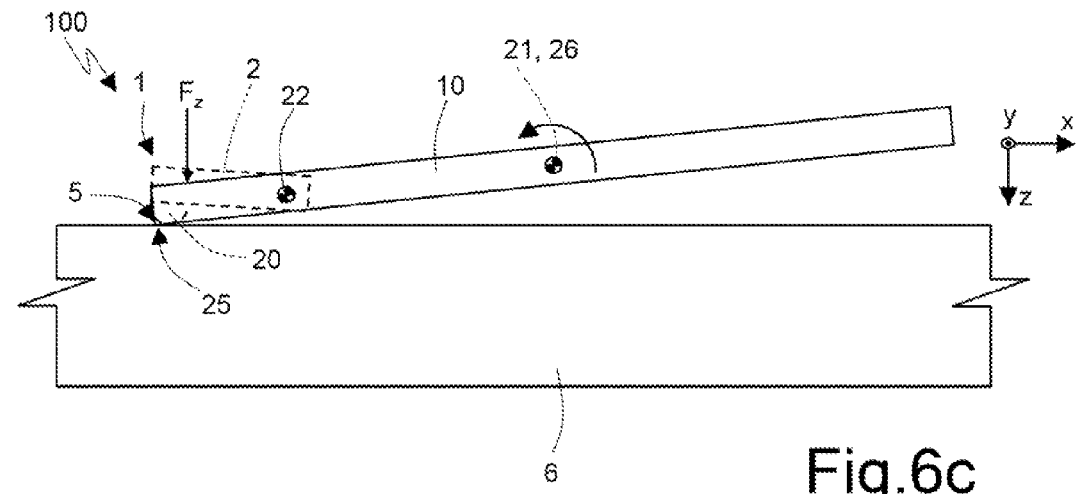

For sufficiently high external forces $F_z$, the flexible element 2 bends, generating a braking force on the mobile mass 10, until the mobile mass 10 comes into direct contact with the substrate 6 (FIG. 6C). More precisely, just one edge 25 of the mobile mass 10 comes into contact with the substrate 6; in this case, the surface of the substrate 6 facing the edge 25 constitutes the stop element 5.

The impact between the mobile mass 10 and the substrate 6 is reduced thanks to the action of the flexible element 2, which reduces the possibility of damage and/or wear to the parts that come into contact.

Also in this case, the continuous use of the anti-stiction structure of FIGS. 4 and 5 can cause wear of the edge 25 of the mobile mass 10 and of the substrate 6 that are in contact with one another, favoring the occurrence of phenomena of stiction. However, also in this case, the flexible element 2 generates a repulsive force $F_{rep}$ that contributes to bringing the mobile mass 10 back into the position illustrated in FIG. 6A.

Figure 7:
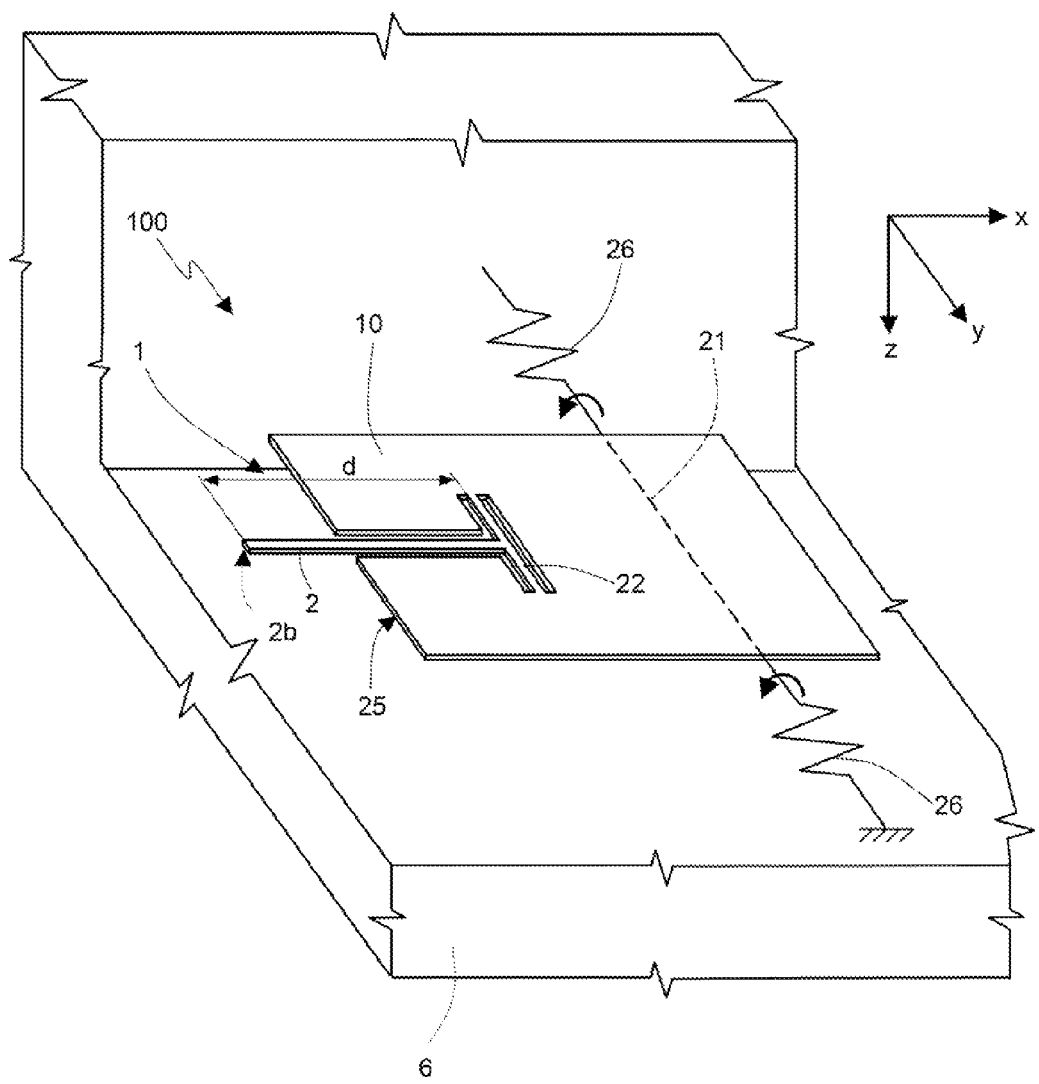
FIG. 7 shows a simplified perspective view of a different implementation of the MEMS device of FIG. 2.

FIG. 7 shows an alternative embodiment of the flexible element 2 usable with a mobile mass 10 of the type illustrated in FIGS. 5 and 6A-6C.

According to this embodiment, the flexible element 2 has a projecting portion 2b extending as a prolongation of the flexible element 2 itself, beyond the perimeter of the mobile mass 10, and being hence integral with the flexible element 2. In practice, the flexible element 2 has a total length d such as to enable it to project beyond the edge 25. In this way, during rotation about the axis of rotation 21, the projecting portion 2b of the flexible element 2 comes into contact with the substrate 6 before the edge 25, behaving in a way substantially similar to the bump 20 of FIG. 5.

Consequently, the anti-stiction structure 1 described enables improvement of the behavior of a generic device 100 in regard to the phenomenon of stiction, limiting the force of contact between two mobile bodies with respect to one another, in particular between a mobile mass and a load-bearing element, during use of the device 100 or on account of undesired accidental shock. In this way, the wear of the surfaces that come into contact, and the consequent stiction, may be considerably reduced.

Finally, it is clear that modifications and variations may be made to the anti-stiction structure 1 described and illustrated herein, without thereby departing from the spirit and scope of the present disclosure.

For example, a number of anti-stiction structures 1 may be present for a single mobile mass 10, set on opposite sides of the mobile mass 10, for example in a symmetrical way. In this way, since the mobile mass 10 may move in opposite senses along the same direction (in the plane of the load-bearing structure 6 or perpendicularly thereto), i.e., oscillate in opposite senses, the phenomenon of stiction for either sense of movement may be reduced.

Likewise, in the example of embodiment of FIG. 5, it is possible to provide bumps 20 extending from the top side of the flexible element 2 so as to reduce stiction of the mobile mass 10 in both directions of rotation, clockwise and counterclockwise, in the case where this were to become necessary.

Furthermore, the load-bearing structure 6 may be any fixed or mobile element, with respect to which the mobile mass 10 moves and with respect to which it is desired to reduce stiction of the mobile mass 10.

The mobile mass 10 may be provided in the same structural layer of the flexible element 2, as illustrated, or else in a different structural layer.

The stop element 5 may be provided on the structural element 6 and/or on the mobile mass 10, and the mobile mass 10 may form part of MEMS devices of a different type, such as accelerometers, gyroscopes, sensors, micromotors, and the like.

Figure 8:
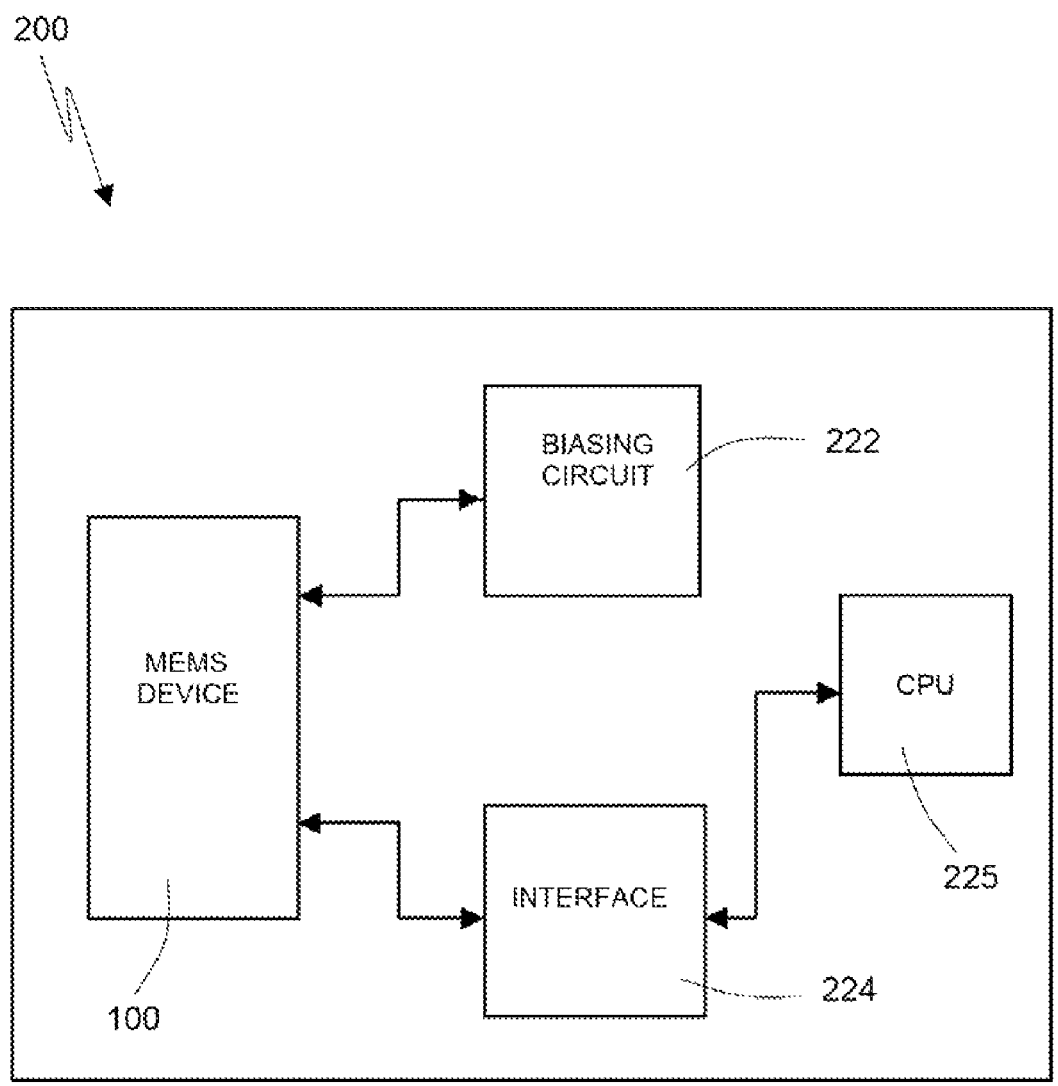
FIG. 8 shows an overall block diagram of an embodiment of an electronic apparatus incorporating the MEMS device described.

For example, the device 100 may be particularly advantageous for use in an electronic apparatus or system 200 (FIG. 8), of a portable type, for example a cellphone, a PDA, a palm-top or portable computer, an digital audio player, a remote control, a video or photographic camera, etc., comprising a microelectromechanical device 100 of the type described previously; a biasing circuit 222, designed to supply electrical biasing quantities to the microelectromechanical device 100 (in a way in itself known and for this reason not described in detail); an interface circuit 224, designed to interface with the microelectromechanical device 100 for reading one or more electrical quantities associated therewith (in a way in itself known and for this reason not described in detail); and a microprocessor control unit 225, connected to the interface circuit 224, and designed to superintend general operation of the electronic apparatus 200.

Naturally, in order to satisfy local and specific requirements, a person skilled in the art may apply to the embodiments described above many modifications and alterations. Particularly, although one or more embodiments have been described with a certain degree of particularity, it should be understood that various omissions, substitutions, and changes in the form and details as well as other embodiments are possible. Moreover, it is expressly intended that specific elements and/or method steps described in connection with any disclosed embodiment may be incorporated in any other embodiment as a general matter of design choice.

What is claimed is:

1. A microelectromechanical device comprising:
   a first structural element;
   a second structural element rotatably coupled to said first structural element;
   an elastic supporting structure extending between said first and second structural elements and configured to enable a rotational movement of said second structural element with respect to the first structural element; and
   an anti-stiction structure including at least one flexible element fixed to only the first structural element and, in a rest condition thereof, arranged at a first distance from the second structural element, said anti-stiction structure being configured to generate a repulsive force between the first and the second structural elements in the case of a relative movement of an amount greater than said first distance, wherein:
   the first structural element comprises a mobile mass, and the second structural element comprises a load-bearing structure, or vice versa;
   said load-bearing structure comprises a substrate, said movable mass being suspended above a surface of said substrate and being rotatably movable with respect to said surface, said flexible element having an elongated shape with a first end fixed to said movable mass and a second end provided with a protruding portion facing and arranged at said first distance from said surface; and said mobile mass has a trench facing a side of the mobile mass and said flexible element extends within said trench.

2. The microelectromechanical device according to claim 1, further comprising a stop element, of a substantially rigid type, fixed only to one of said first and second structural elements wherein, in a rest condition of said device, said stop element being arranged at a second distance from another structural element of said first and second structural elements, said second distance being less than said first distance, and being configured to limit the relative movement between said first and second structural elements.

3. The microelectromechanical device according to claim 2, wherein said stop element is distinct from said flexible element and directly faces an abutment portion of said another structural element between said first and second structural elements.

4. The microelectromechanical device according to claim 1, wherein said flexible element has an elongated shape extending transversely to a direction of movement of the mobile mass and is provided with an end forming an abutment surface facing a portion of said substrate.

5. The microelectromechanical device according to claim 1, wherein said protruding portion comprises a bump extending transversely to said surface.

6. The microelectromechanical device according to claim 1, wherein said protruding portion extends as a prolongation of the flexible element, beyond said side of the mobile mass.

7. The microelectromechanical device according to claim 1, wherein the elastic supporting structure includes a torsional spring coupled to and extending between the first and second structural elements.

8. An apparatus, comprising:
a substrate;
a mass suspended above a surface of said substrate and being rotatably movable with respect to said surface, the mass having a trench facing a side of the mobile mass;
a first elastic member having a first end coupled to the substrate and having a second end coupled to the mass, the first elastic member being configured to enable a rotational movement of the mass with respect to the substrate; and
an anti-stiction structure including an anti-stiction element coupled to the mass and, in a rest condition thereof, arranged at a first distance from the substrate, said anti-stiction structure being configured to generate a repulsive force between the mass and substrate in the case of a relative movement of an amount greater than said first distance, said anti-stiction element having an elongated shape extending in the trench of the mass and having a first end coupled to said movable mass.

9. The apparatus of claim 8 wherein the substrate comprises a semiconductor substrate.

10. The apparatus of claim 8, wherein the first elastic member comprises a spring.

11. The apparatus of claim 8 wherein the anti-stiction element includes a protuberance extending toward the surface of the substrate from a surface of the anti-stiction element that faces the surface of the substrate.

12. The apparatus of claim 8 wherein the trench is T-shaped and has a first portion extending transversely from the side of the mass and a second portion extending transversely from the first portion, the anti-stiction element extends in the first portion, the anti-stiction further includes a torsional spring coupled to the mass, extending in the second portion, and having a central portion coupled to the anti-stiction element.

13. The apparatus of claim 8, further comprising:
a mass stop extending from the surface of the substrate and spaced from the mass.

14. The apparatus of claim 8, wherein the mass comprises a surface that faces the substrate, the apparatus further comprising:
a mass stop extending from the surface of the mass and spaced from the substrate.

15. The apparatus of claim 8 wherein:
the anti-stiction element has a second end protrudes beyond the side of the mass.

16. The apparatus of claim 8 wherein the mass includes a plate that is substantially parallel to a portion of the substrate.

17. The apparatus according to claim 8, wherein the first elastic element includes a torsional spring coupled to and extending between the mass and substrate.

* * * * *